(12) United States Patent
Jeon et al.

(10) Patent No.: US 9,385,458 B2
(45) Date of Patent: Jul. 5, 2016

(54) MEZZANINE HEADER CONNECTOR

(71) Applicants: Tyco Electronics Corporation, Berwyn, PA (US); Tyco Electronics (Shanghai) Co. Ltd., Shanghai (CN)

(72) Inventors: James Myoungsoo Jeon, Harrisburg, PA (US); Chad W. Morgan, Carneys Point, NJ (US); Liang Huang, Shanghai (CN)

(73) Assignees: TYCO ELECTRONICS CORPORATION, Berwyn, PA (US); TYCO ELECTRONICS (SHANGHAI) CO. LTD., Shanghai (CN)

( * ) Notice: Subject to any disclaimer, the term of this patent is extended or adjusted under 35 U.S.C. 154(b) by 31 days.

(21) Appl. No.: 14/283,367

(22) Filed: May 21, 2014

(65) Prior Publication Data

US 2015/0303598 A1 Oct. 22, 2015

(30) Foreign Application Priority Data

Apr. 22, 2014 (CN) .............................. 201410162730

(51) Int. Cl.
*H01R 12/00* (2006.01)
*H01R 12/73* (2011.01)
*H01R 13/6587* (2011.01)
(Continued)

(52) U.S. Cl.
CPC ............ *H01R 12/73* (2013.01); *H01R 13/6587* (2013.01); *H01R 12/716* (2013.01); *H01R 13/6477* (2013.01); *H05K 3/368* (2013.01); *H05K 2201/042* (2013.01)

(58) Field of Classification Search
CPC .............................. H01R 9/096; H01R 23/725

USPC .................................................. 439/74, 65, 66
See application file for complete search history.

(56) References Cited

U.S. PATENT DOCUMENTS 7,390,194 B1 * 6/2008 Crippen ............. H01R 43/0235
439/65
7,597,581 B2 * 10/2009 Trout ................... H01R 13/633
439/474

(Continued)

FOREIGN PATENT DOCUMENTS

WO 03/094304 11/2003

OTHER PUBLICATIONS

International Search Report dated Dec. 17, 2015 for International Application No. PCT/US2015/026272.

*Primary Examiner* — Abdullah Riyami
*Assistant Examiner* — Thang Nguyen

(57) ABSTRACT

A mezzanine header connector includes a contact assembly having a pair of contact modules arranged back-to-back. The contact modules each have a dielectric holder holding a plurality of header contacts. The dielectric holder extends between a mating end and a mounting end and has an inner side and an outer side. The header contacts have mating segments exposed along the outer side at the mating end for termination to corresponding receptacle contacts of a mezzanine receptacle connector. The header contacts have terminating segments extending from the mounting end of the dielectric holder for termination to a circuit board. Each of the header contacts extend along a linear path between the corresponding mating segment and the corresponding terminating segment. The inner sides of the dielectric holders of the pair of contact modules abut against each other such that the header contacts face away from each other.

19 Claims, 6 Drawing Sheets

(51) Int. Cl.
*H01R 13/6477* (2011.01)
*H01R 12/71* (2011.01)
*H05K 3/36* (2006.01)

(56) References Cited

U.S. PATENT DOCUMENTS

| | | | | |
|---|---|---|---|---|
| 7,837,479 | B1 | 11/2010 | Millard et al. | |
| 7,967,638 | B1 * | 6/2011 | Kline | H01R 12/7082 439/607.07 |
| 7,985,079 | B1 * | 7/2011 | Wilson | H01R 12/52 439/74 |
| 8,157,591 | B2 * | 4/2012 | Fedder | H01R 13/514 439/108 |
| 8,398,434 | B2 * | 3/2013 | Davis | H01R 12/724 439/607.34 |
| 8,485,831 | B2 * | 7/2013 | Cipolla | H01R 13/514 439/607.07 |
| 2007/0259538 | A1 * | 11/2007 | Brodsky | H05K 3/368 439/66 |
| 2009/0004892 | A1 * | 1/2009 | Weber | H01R 12/52 439/74 |
| 2010/0184307 | A1 * | 7/2010 | Arai | H04M 1/76 439/65 |
| 2012/0178273 | A1 * | 7/2012 | Cipolla e | H01R 13/6587 439/65 |
| 2012/0295453 | A1 * | 11/2012 | Cipolla | H01R 12/716 439/67 |
| 2013/0217263 | A1 | 8/2013 | Pan | |

* cited by examiner

MEZZANINE HEADER CONNECTOR

BACKGROUND OF THE INVENTION

The subject matter herein relates generally to mezzanine header connectors.

Known mezzanine connectors mechanically and electrically interconnect a pair of circuit boards in a parallel arrangement. Typically, the mezzanine connector will engage both circuit boards to interconnect the circuit boards. For example, the mezzanine connector will be mounted to one of the circuit boards and will engage the other circuit board at a separable mating interface. The mezzanine connector typically uses deflectable spring beams at the separable mating interface. However, such interfaces require a significant amount of real estate and space because the spring beams require long beam lengths to achieve the required spring force and deformation range. Contact density of such mezzanine connectors is limited because of the separable mating interface. At least some known mezzanine connector systems utilize two mezzanine connectors, each mounted to a different circuit board and then mated together. Such systems can be complex and difficult to manufacture. For example, such mezzanine connectors have many contacts individually loaded into a housing, which may be difficult and time consuming to assemble. Furthermore, known mezzanine connectors suffer from signal performance limits due to the tight spacing of the contacts in the mezzanine connectors.

Thus, a need exists for a mezzanine connector assembly that provides a cost effective and reliable connection between circuit boards.

BRIEF DESCRIPTION OF THE INVENTION

In one embodiment, a mezzanine header connector is provided including a contact assembly having a pair of contact modules arranged back-to-back. The contact modules each have a dielectric holder holding a plurality of header contacts. The dielectric holder extends between a mating end and a mounting end opposite the mating end and has an inner side and an outer side. The header contacts have mating segments exposed along the outer side at the mating end for termination to corresponding receptacle contacts of a mezzanine receptacle connector. The header contacts have terminating segments extending from the mounting end of the dielectric holder for termination to a circuit board. Each of the header contacts extend along a linear path between the corresponding mating segment and the corresponding terminating segment. The inner sides of the dielectric holders of the pair of contact modules abut against each other such that the header contacts face away from each other.

In another embodiment, a mezzanine header connector is provided including a contact assembly having a first contact module and a second contact module coupled to the first contact module. The first contact module includes a first dielectric holder holding a plurality of first header contacts. The first dielectric holder extends between a mating end and a mounting end opposite the mating end. The first dielectric holder has an inner side and an outer side. The first header contacts have mating segments exposed along the outer side at the mating end for termination to corresponding receptacle contacts of a mezzanine receptacle connector and terminating segments extending from the mounting end of the first dielectric holder for termination to a circuit board. Each first header contact extends along a linear path between the corresponding mating segment and the corresponding terminating segment. The second contact module includes a second dielectric holder holding a plurality of second header contacts. The second dielectric holder extends between a mating end and a mounting end opposite the mating end. The second dielectric holder has an inner side and an outer side with the inner side of the second dielectric holder abutting against the inner side of the first dielectric holder. The second header contacts have mating segments being exposed along the outer side of the second dielectric holder at the mating end thereof for termination to corresponding header contacts of the mezzanine receptacle connector and terminating segments extending from the mounting end of the second dielectric holder for termination to the circuit board. Each second header contact extends along a linear path between the corresponding mating segment and the corresponding terminating segment.

In a further embodiment, a mezzanine header connector is provided including a contact assembly comprising a pair of contact modules arranged back-to-back. The contact modules each have a dielectric holder holding a plurality of header contacts. The dielectric holder extends between a mating end and a mounting end opposite the mating end. The dielectric holder has an inner side and an outer side. The header contacts have mating segments being exposed along the outer side at the mating end for termination to corresponding receptacle contacts of a mezzanine receptacle connector. The header contacts have terminating segments extending from the mounting end of the dielectric holder for termination to a circuit board. Each of the header contacts extend along a linear path between the corresponding mating segment and the corresponding terminating segment. The inner sides of the dielectric holders of the pair of contact modules abut against each other such that the header contacts face away from each other. A housing frame holds the contact assembly. The housing frame has walls defining pockets receiving corresponding header contacts of the contact assembly. The housing frame is conductive and provides shielding around corresponding header contacts of the contact assembly. The header contacts face associated walls with air separating the header contacts and the walls along a majority of the header contacts.

DETAILED DESCRIPTION OF THE INVENTION

Figure 1:
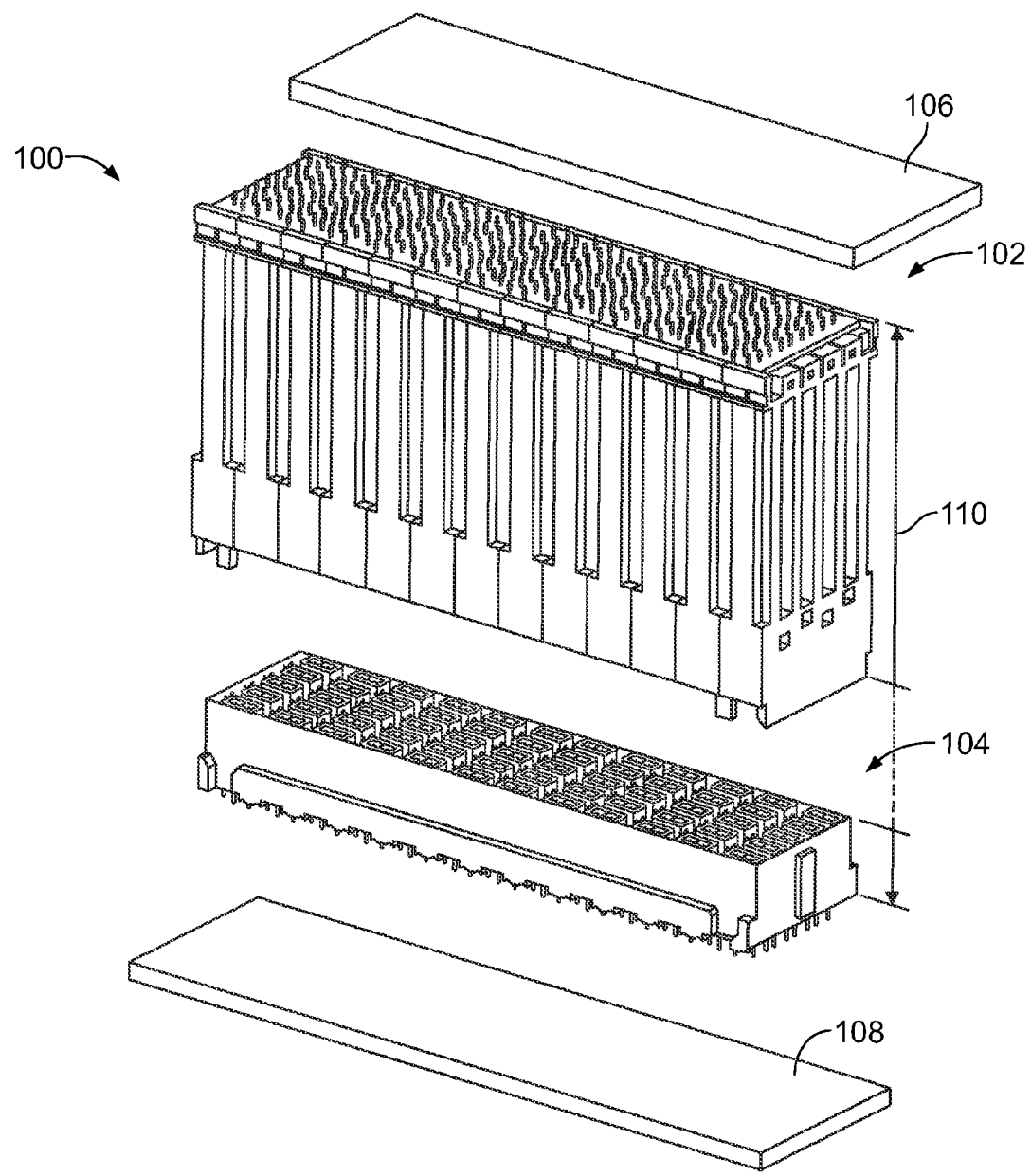
FIG. 1 illustrates a mezzanine connector assembly formed in accordance with an exemplary embodiment.

FIG. 1 illustrates a mezzanine connector assembly 100 formed in accordance with an exemplary embodiment. The mezzanine connector assembly 100 includes a mezzanine header connector 102 and a mezzanine receptacle connector 104 that are mated together to electrically connect first and second circuit boards 106, 108. The mezzanine header connector 102 and mezzanine receptacle connector 104 are arranged to interconnect the first and second circuit boards 106, 108 in a parallel arrangement. However, it is realized that the subject matter herein may be used in other types of electrical connectors as well, such as right angle connectors, cable connectors (being terminated to an end of one of more cables), or other types of electrical connectors.

The circuit boards 106, 108 are interconnected by the header and receptacle connectors 102, 104 so that the circuit boards 106, 108 are substantially parallel to one another. The first and second circuit boards 106, 108 include conductors that communicate data signals and/or electric power between the header and receptacle connectors 102, 104 and one or more electric components (not shown) that are electrically connected to the circuit boards 106, 108. The conductors may be embodied in electric pads or traces deposited on one or more layers of the circuit boards 106, 108, in plated vias, or in other conductive pathways, contacts, and the like.

The mezzanine header and receptacle connectors 102, 104 separate the first and second circuit boards 106, 108 by a stack height 110, which is the combined height of the header and receptacle connectors 102, 104 when mated. In an exemplary embodiment, the mezzanine header connector 102 is scalable to adjust or change the stack height 110. For example, the stack height 110 may be varied by utilizing different mezzanine header connectors 102 having different heights. Differently sized header connectors 102 may be provided, defining a family of mezzanine header connectors 102. The different members of the family have different heights so the appropriate or desired stack height 110 may be achieved. The interfaces of the mezzanine header connectors 102 with the mezzanine receptacle connector 104 may be identical for all members of the family. Similarly, the interfaces of the mezzanine header connectors 102 with the first circuit board 106 may be identical for all members of the family such that only the mezzanine header connector 102 needs to be replaced to change the stack height 110, while the mezzanine receptacle connector 104 and circuit boards 106, 108 may be the same.

In an exemplary embodiment, the mezzanine header connector 102 is modular in design, having any number of modules or units stacked together to vary the number of conductors within the mezzanine header connector 102. The various modules or units may have different characteristics. For example, the modules or units may communicate data signals, may communicate electric power, or may communicate both data and power. Different modules or units may have different features that change the impedance of the signal conductors within such module or unit. For example, some or all of the modules or units may be designed for operation at 100 ohms. Some or all of the modules or unites may be designed for operation at 85 ohms. Some or all of the modules or units may be designed to operate at different impedance levels, such as 92 ohms.

Figure 2:
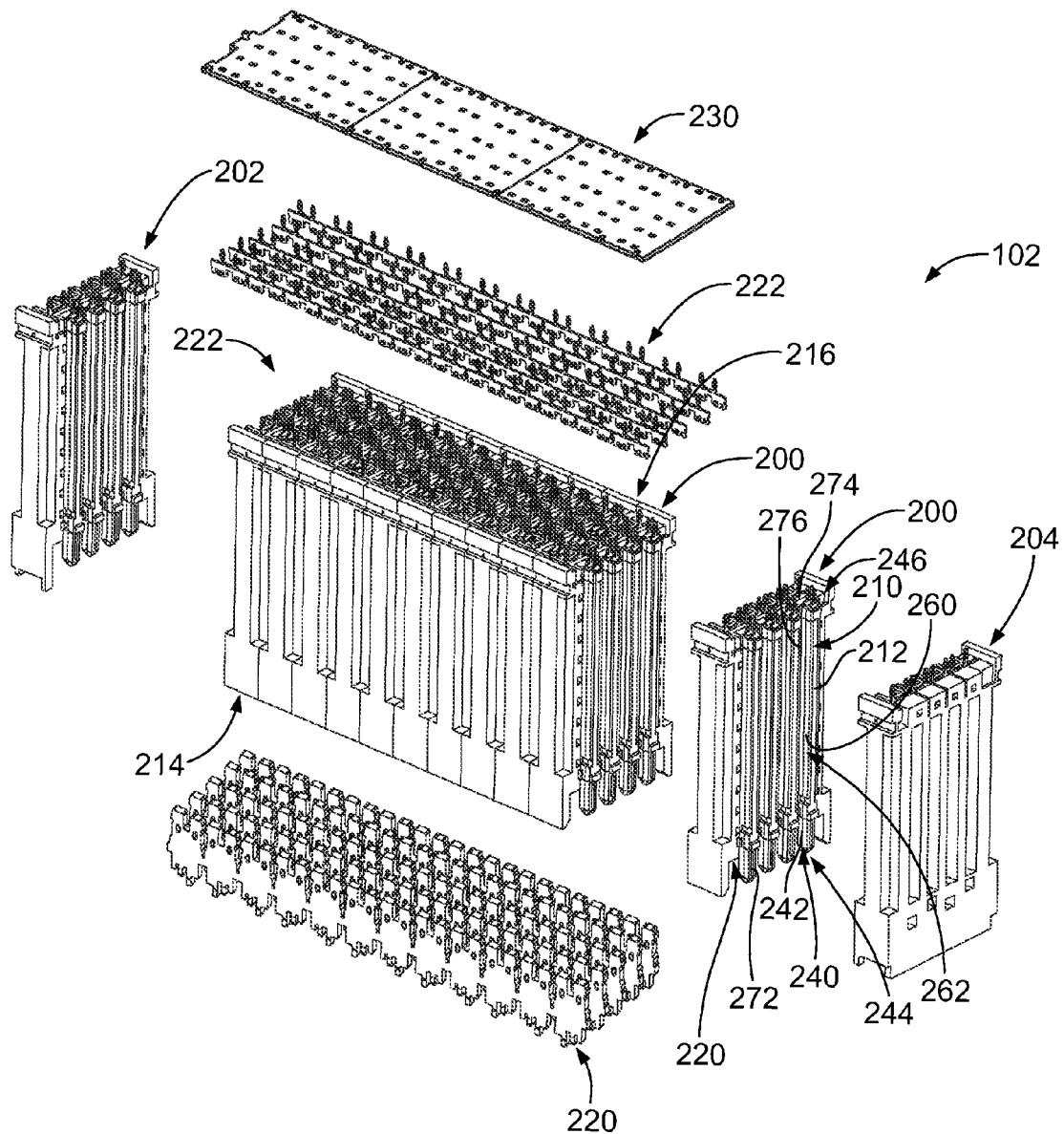
FIG. 2 is an exploded view of a mezzanine header connector of the mezzanine connector assembly that is formed in accordance with an exemplary embodiment.

FIG. 2 is an exploded view of the mezzanine header connector 102 in accordance with an exemplary embodiment. The mezzanine header connector 102 includes a plurality of header modules 200, 202, 204. The header modules 200 define middle header modules, which are flanked on opposite sides by the end header modules 202, 204. Any number of middle header modules 200 may be provided depending on the particular application. The end header modules 202, 204 may be identical to one another, or alternatively may be different from one another. The header modules 200, 202, 204 abut against one another to create continuous perimeter walls of the mezzanine header connector 102. No electrical discontinuities exist between the edges of the header modules 200, 202, 204, which provides shielding entirely around the mezzanine header connector 102.

The header modules 200, 202, 204 hold contact assemblies 210 each having a plurality of header contacts 212. The header modules 200, 202, 204 are stacked adjacent each other in abutting contact with each other to provide electrical shielding for the header contacts 212. In an exemplary embodiment, the header contacts 212 are arranged in pairs that carry differential signals. The header modules 200, 202, 204 surround the individual pairs of header contacts 212 and provide electrical shielding around each of the pairs of header contacts 212. In alternative embodiments, the header contacts 212 may carry single ended signals rather than differential signals. In other alternative embodiments, the header contacts 212 may carry power rather than data signals.

The header contacts 212 extend between a front 214 of the mezzanine header connector 102 and a rear 216 of the mezzanine header connector 102. The front 214 is configured to be mated with the mezzanine receptacle connector 104 (shown in FIG. 1). The rear 216 is configured to be mounted to the first circuit board 106 (shown in FIG. 1). In an exemplary embodiment, the header modules 200, 202, 204 provide electrical shielding for the header contacts 212 along substantially the entire length of the header contacts 212 between the front 214 and the rear 216.

The mezzanine header connector 102 includes a plurality of front header ground shields 220 at the front 214 and a plurality of rear header ground shields 222 at the rear 216. The header ground shields 220, 222 may be inserted into the header modules 200, 202, 204 such that the header ground shields 220, 222 provide electrical shielding for the header contacts 212. The header ground shields 220, 222 may be electrically connected to one or more conductive surfaces of the header modules 200, 202, 204. The header ground shields 220, 222 are configured to be electrically connected to the mezzanine receptacle connector 104 and the first circuit board 106, respectively.

In an exemplary embodiment, the front header ground shields 220 define a front ground lattice to provide shielding around multiple sides of each pair of header contacts 212. For example, the front header ground shields 220 may include both longitudinal components and lateral components that provide shielding between rows and columns of the header contacts 212. The rear header ground shields 222 define a rear ground lattice to provide shielding around multiple sides of each pair of header contacts 212. For example, the rear header ground shields 222 may include both longitudinal components and lateral components that provide shielding between rows and columns of the header contacts 212.

In an exemplary embodiment, the mezzanine header connector 102 includes a pin organizer 230. The pin organizer 230 is configured to be coupled to the rear 216 of the mezzanine header connector 102. The pin organizer 230 includes a plurality of openings therethrough that receive corresponding pins of the header contacts 212 and/or the rear header ground shields 222. The pin organizer 230 holds the relative positions of the header contacts 212 and/or rear header ground shields 222 for mounting to the first circuit board 106 (shown in FIG. 1). The pin organizer 230 may protect the pins of the header contacts 212 and/or the rear header ground shields 222 from damage, such as during shipping, assembly, and/or mounting to the first circuit board 106.

Figure 3:
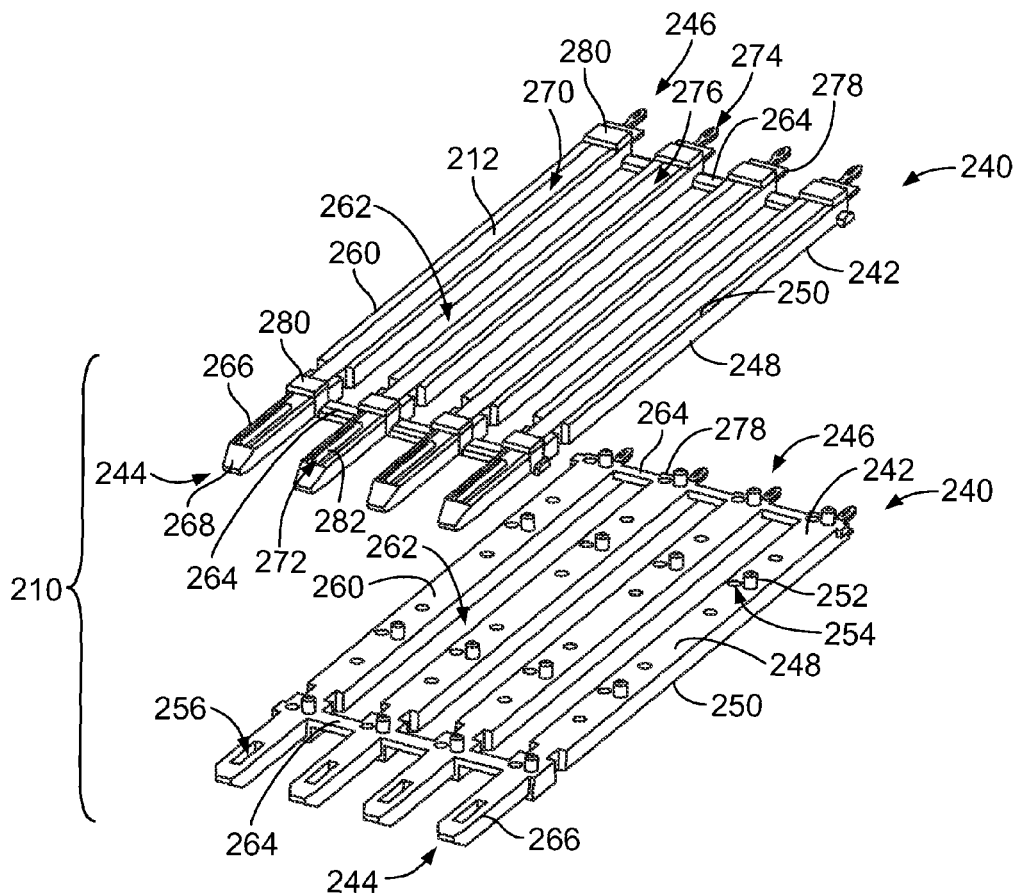
FIG. 3 is an exploded view of a contact assembly of the mezzanine header connector.

FIG. 3 is an exploded view of the contact assembly 210. The contact assembly 210 includes a pair of contact modules 240 arranged back-to-back. The contact modules 240 are shown separated from one another; however the contact modules 240 may be coupled together by pressing the contact modules 240 against each other. In an exemplary embodiment, the contact modules 240 are identical to one another and are inverted 180° relative to one another. Having the contact modules 240 identical minimizes tooling cost. In alternative embodiments, the contact modules 240 may define complementary mating halves of the contact assembly 210 that are similar to one another but include at least some different features, such as for coupling the contact modules 240 together.

Each contact module 240 includes a dielectric holder 242 that holds a plurality of the header contacts 212. In an exemplary embodiment, the dielectric holder 242 is overmolded over and/or around a leadframe 243 (shown in FIG. 4) that includes the header contacts 212. The header contacts 212 may be coupled to the dielectric holder 242 by methods other than overmolding in alternative embodiments.

Each dielectric holder 242 extends between a mating end 244 and a mounting end 246 opposite the mating end 244. The mating end 244 is configured to be mated with the mezzanine receptacle connector 104 (shown in FIG. 1), while the mounting end 246 is configured to be coupled to the first circuit board 106 (shown in FIG. 1).

Each dielectric holder 242 has an inner side 248 and an outer side 250. The inner sides 248 of the pair of dielectric holders 242 abut against each other when the contact modules 240 are coupled together. The inner sides 248 may be generally flat allowing the inner sides 248 of the pair of dielectric holders 242 to sit flush with one another.

Each dielectric holder 242 includes posts 252 extending from the inner side 248 and openings 254 formed in the inner side 248. When the contact modules 240 are coupled together, the posts 252 are aligned with corresponding openings 254 in the other dielectric holder 242 and pressed into the openings 254 to securely couple the contact modules 240 together. For example, the posts 252 may be held in corresponding openings 254 by an interference fit. Other securing features may be used in alternative embodiments, such as fasteners, clips, latches, adhesives, and the like. In alternative embodiments, rather than both dielectric holders 242 including posts 252 and openings 254, one of the dielectric holders 242 may include the posts 252 while the other dielectric holder 242 may include the openings 254.

Each dielectric holder 242 may include pockets 256 open along the inner side 248. The pockets 256 may be filled with air. The pockets 256 may be aligned with the header contacts 212 to affect electrical characteristics, such as the impedance, of the signal or transmission lines defined by the header contacts 212. The length and proximity of the pockets 256 to the header contacts 212 may be controlled to affect the impedance or other electrical characteristics.

Each dielectric holder 242 includes a plurality of rails 260 separated by gaps 262. Each rail 260 holds a corresponding header contact 212. The rails 260 are connected by connecting segments 264 that hold the positions of the rails 260 relative to one another. In an exemplary embodiment, the dielectric holder 242 is molded and the connecting segments 264 are formed by portions of the mold that allow the dielectric material to flow between the various rails 260. Any number of rails 260 may be provided depending on the particular application and the number header contacts 212 associated with the contact module 240. In the illustrated embodiment, four rails 260 are provided to support the four header contacts 212. The rails 260 extend along generally linear paths between the mating end 244 and the mounting end 246. At the mating end 244, the rails 260 define front support beams 266 that are cantilevered forward of the connecting segments 264. The front support beams 266 support portions of the header contacts 212. The front support beams 266 have ramped lead-ins 268 that lead to the header contacts 212. The lead-ins 268 prevent stubbing when the contact assembly 210 is mated with the mezzanine receptacle connector 104 (shown in FIG. 1).

In an exemplary embodiment, the header contacts 212 are exposed along the outer side 250 of the dielectric holder 242. For example, the dielectric holder 242 is overmolded around the header contacts 212 such that side surfaces 270 of the header contacts 212 are flush with and exposed at the outer side 250.

In an alternative embodiment, rather than having two dielectric holders 242 arranged back-to-back, the contact assembly 210 may include a single dielectric holder 242. The single dielectric holder 242 may have header contacts 212 arranged along both sides, or alternatively along only one side.

Figure 4:
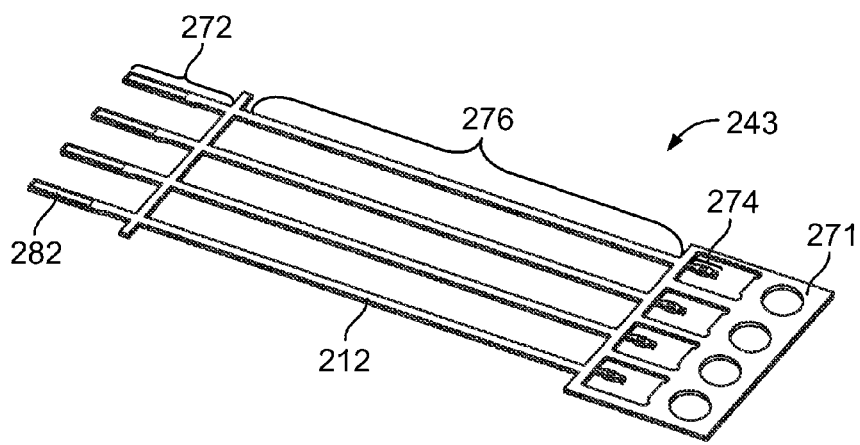
FIG. 4 is a perspective view of a leadframe of the contact assembly.

FIG. 4 is a perspective view of the leadframe 243 of header contacts 212 in accordance with an exemplary embodiment. The leadframe 243 includes a carrier 271 that holds the header contacts 212 together. The leadframe 243 is stamped and formed from a blank and configured to be overmolded by the dielectric holder 242 (shown in FIG. 3).

With additional reference back to FIG. 3, in an exemplary embodiment, the header contacts 212 include mating segments 272, terminating segments 274, and intermediate segments 276 extending between the mating segments 272 and terminating segments 274. The header contacts 212 extend along generally linear paths from the mating segments 272, along the intermediate segments 276, to the terminating segments 274. In an exemplary embodiment, at least a portion of each intermediate segment 276 is exposed along the outer side 250. Optionally, a majority of the length of each intermediate segment 276 is exposed to air along the outer side 250.

The mating segments 272 are exposed along the outer side 250 at the mating end 244 for termination to corresponding receptacle contacts (not shown) of the mezzanine receptacle connector 104 (shown in FIG. 1). For example, the mating segments 272 are exposed along the front support beams 266. In the illustrated embodiment, the mating segments 272 include convex interference bumps 282. The interference bumps 282 may be formed by pressing or coining the header contacts 212 to give the header contacts 212 a rounded shape to define a mating interface for mating with corresponding receptacle contacts of the mezzanine receptacle connector 104 (shown in FIG. 1). The convex interference bumps 282 may lower the resistance at the mating interface with the mating contacts of the mezzanine receptacle connector 104 by providing a smaller surface area and thus higher mating pressure between the header contacts 212 and the receptacle contacts of the mezzanine receptacle connector 104. Optionally, the interference bumps 282 may be plated, such as with gold plating.

The terminating segments 274 extend from the mounting end 246 beyond a rear edge 278 of the dielectric holder 242 for termination to the first circuit board 106 (shown in FIG. 1). The terminating segments 274 are exposed exterior of the dielectric holder 242. Optionally, the terminating segments 274 may be plated with a plating material, such as tin plating. In the illustrated embodiment, the terminating segments 274 include compliant pins, such as eye-of-the-needle pins, that are configured to be terminated to the first circuit board 106 by pressing the compliant pins into plated vias of the first circuit board 106. Other types of terminating segments may be provided in alternative embodiments, such as solder tails, solder balls, deflectable spring beams, and the like.

In the illustrated embodiment, the dielectric holder 242 includes caps 280 that extend over portions of the intermediate segments 276 to secure the header contacts 212 in the dielectric holder 242. Optionally, the caps 280 may be aligned with the connecting segments 264. The caps 280 may cover opposite ends of the intermediate segments 276, such as at the intersections of the intermediate segments 276 with the mating segments 272 and with the terminating segments 274. The caps 280 may be positioned proximate to the areas of the header contacts 212 that are trimmed or cut from the carrier 271 of the leadframe that initially holds the header contacts 212 together prior to overmolding.

With additional reference back to FIG. 2, when the contact modules 240 of the pair are coupled together, the rails 260 are aligned back-to-back. The mating segments 272 are aligned with one another on opposite sides of the contact module 240. The header contacts 212 on opposite sides of the contact assembly 210 define differential pairs of header contacts 212. The gaps 262 are provided between differential pairs of the header contacts 212 to allow portions of the header modules 200, 202, 204 (shown in FIG. 2) to pass between adjacent differential pairs of the header contacts 212. The header modules 200, 202, 204 provide electrical shielding between pairs of the header contacts 212, such that each pair of header contacts 212 is electrically shielded from each other pair.

In an exemplary embodiment, a length of the contact module 240 between the mating end 244 and mounting end 246 of the dielectric holder 242 is scalable to change a height of the mezzanine header connector 102 (shown in FIG. 2). For example, lengths of the rails 260 may be varied by pre-selecting a specific length as desired to change the spacing between the mating end 244 and mounting end 246. Similarly, the lengths of the header contacts 212 may also be scalable to coincide with the lengths of the dielectric holder 242. For example, the lengths of the intermediate segments 276 may be pre-selectively lengthened or shortened to change the spacing between the mating segments 272 and terminating segments 274.

In an exemplary embodiment, the dielectric material of the dielectric holder 242 may be selectable to change an impedance of the contact assembly 210. For example, for a given spacing between the header contacts 212, changing the dielectric material of the dielectric holder 242 may change the impedance of the transmission lines of the header contacts 212. For example, in a first embodiment, a first dielectric material having a dielectric constant of approximately 3.5 may be used to achieve a target impedance of approximately 100 ohms. In a second embodiment, a second and different dielectric material having a dielectric constant of approximately 5.1 may be selected to achieve a target impedance of approximately 85 ohms. The impedance may be changed without changing the geometry of the header contacts 212, but rather merely changing the dielectric material of the dielectric holder 242. Using a material having a higher dielectric constant lowers the impedance of the transmission lines of the header contacts 212. Different target impedance values may be achieved without any tooling change to the headers contacts 212 or the mold used to form the dielectric holder 242.

Figure 5:
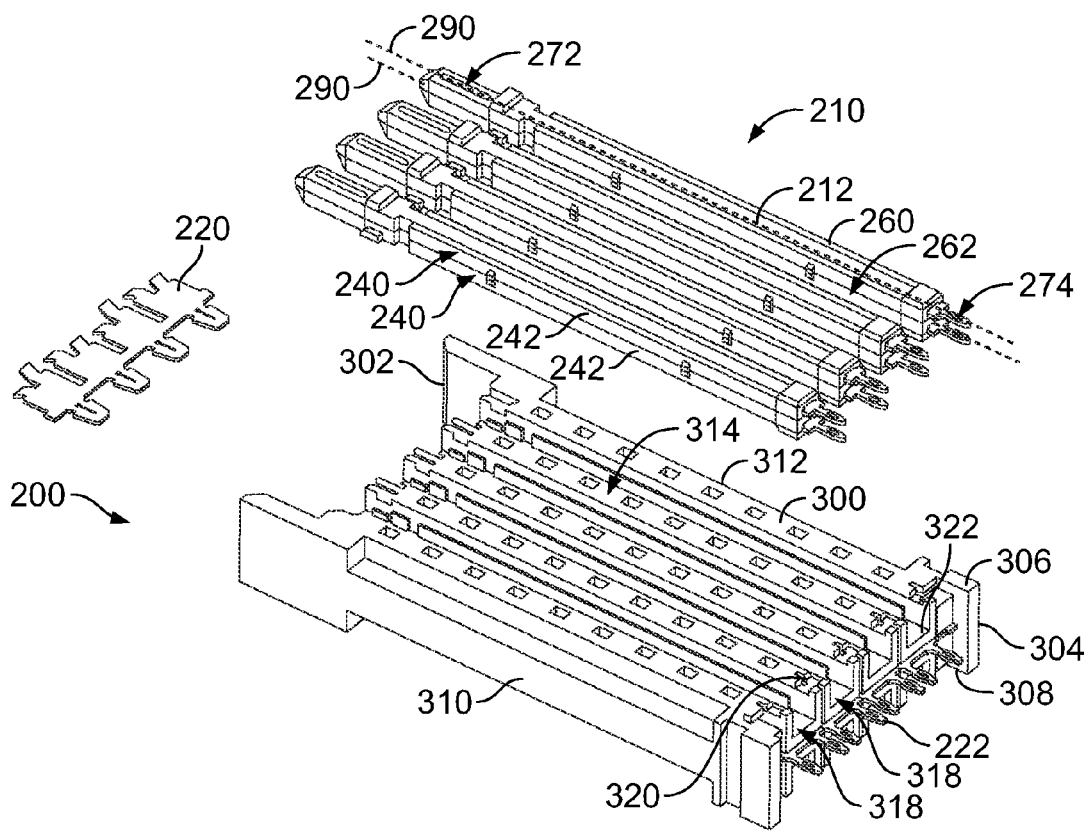
FIG. 5 is an exploded view of a header module of the mezzanine header connector and formed in accordance with an exemplary embodiment.
Figure 6:
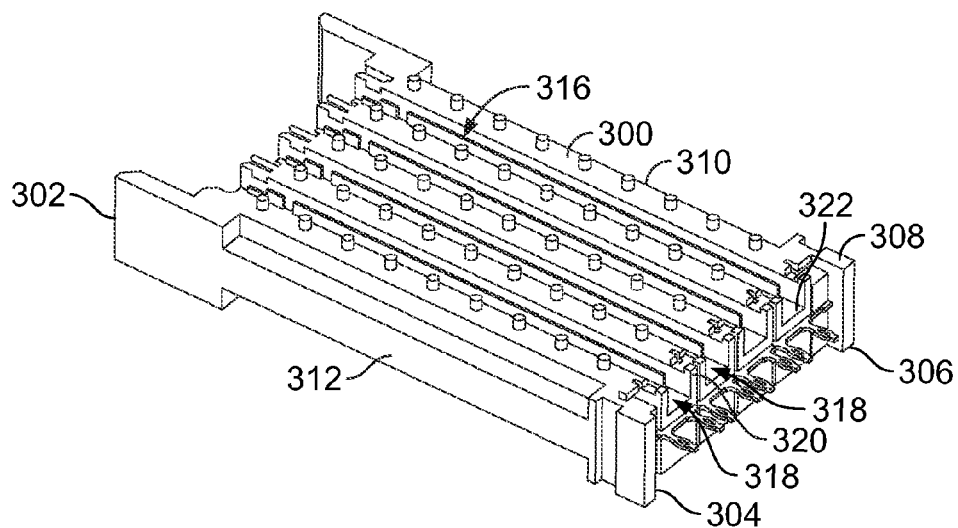
FIG. 6 shows a portion of the header module shown in FIG. 5.

FIG. 5 is an exploded view of the middle header module 200 formed in accordance with an exemplary embodiment. FIG. 6 shows a portion of the middle header module 200. FIG. 5 shows the contact assembly 210 in an assembled state with the pair of contact modules 240 coupled together. As noted above, the header contacts 212 are arranged in pairs on opposites sides of the contact assembly 210. In an exemplary embodiment, the header contacts 212 extend parallel to one another along respective contact axes 290. The header contacts 212 within each pair are separated from each other by the dielectric material of the pair of dielectric holders 242. Adjacent pairs of header contacts 212 are separated from each other by the gaps 262 between the corresponding rails 260.

The middle header module 200 includes a housing frame 300 that receives and supports the contact assembly 210. FIG. 5 shows the housing frame 300 from one side while FIG. 6 shows the housing frame 300 from the opposite side. In an exemplary embodiment, the housing frame 300 is conductive and provides electrical shielding for the header contacts 212 of the contact assembly 210. For example, the housing frame 300 may be manufactured from a metalized plastic material, a plated plastic material, a die cast metal material, and the like. The housing frame 300 extends between a front or mating end 302 and a rear or mounting end 304 opposite the front end 302. The housing frame 300 includes opposite first and second sides 306, 308 and opposite first and second edges 310, 312 that extend between the first and second sides 306, 308. The edges 310, 312 define an exterior of the mezzanine header connector 102 (shown in FIG. 2). In an exemplary embodiment, the edges 310, 312 may abut against edges 310, 312 of an adjacent header frame 300 to create continuous perimeter walls of the mezzanine header connector 102 (see, for example, FIG. 2). The first and second sides 306, 308 face other header modules 200, 202, 204 when assembled.

In an exemplary embodiment, the housing frame 300 includes a first chamber 314 (FIG. 5) in the first side 306. The first chamber 314 receives the contact assembly 210. Optionally, a second chamber 316 (FIG. 6) may be provided in the second side 308 that receives a portion of a contact assembly 210 of an adjacent header module 200 or 202 (shown in FIG. 2). Optionally, when the contact assembly 210 is received in the first chamber 314, a portion of the contact assembly 210 may extend beyond the first side 306. For example, one of the contact modules 240 may be received within the first chamber 314 while the other contact module 240 of the contact assembly 210 may be positioned exterior of the first chamber 314 for reception into a second chamber 316 of an adjacent header module 200.

In an exemplary embodiment, the first chamber 314 is divided into discrete pockets 318 by tabs 320 that extend into the first chamber 314. The tabs 320 are configured to be received in corresponding gaps 262 between the rails 260 of at least one of the contact modules 240. The tabs 320 provide electrical shielding between the header contacts 212 associated with the rails 260 received in the pockets 318 on opposite sides of the tabs 320. The tabs 320 define walls that are positioned between header contacts 212 of different pairs of the header contacts 212. The housing frame 300 includes interior walls 322 positioned at the interior of the first chamber 314. The interior walls 322 and associated tabs 320 surround the differential pairs of header contacts 212 to provide electrical shielding for the differential pairs of header contacts 212. The second chamber 316 may include similar tabs 320 and pockets 318.

The front header ground shields 220 are configured to be coupled to the front end 302 of the housing frame 300. For example, the housing frame 300 may include a slot or channel that receives the front header ground shields 220. Alternatively, at least some of the front header ground shields 220 may be embedded in the housing frame 300, such as by being overmolded by the housing frame 300. The rear header ground shields 222 are provided at the rear end 304 of the housing frame 300. Optionally, the rear header ground shield 222 may be molded into the rear end 304 such that portions of the housing frames 300 surround the rear header ground shield 222. Alternatively, the rear header ground shields 222 may be separate from the housing frame 300 and inserted into the housing frame 300. Mounting pins of the rear header ground shield 222 may extend beyond the rear end 304 for termination to the first circuit board 106 (shown in FIG. 1). Other header ground shields 220, 222 may be coupled to the header ground shields 220, 222, such as to create the ground lattices at both the front end 302 and the rear end 304 of the housing frame 300 to provide circumferential shielding around the pairs of header contacts 212 at the mating and terminating segments 272, 274 of the header contacts 212.

Figure 7:
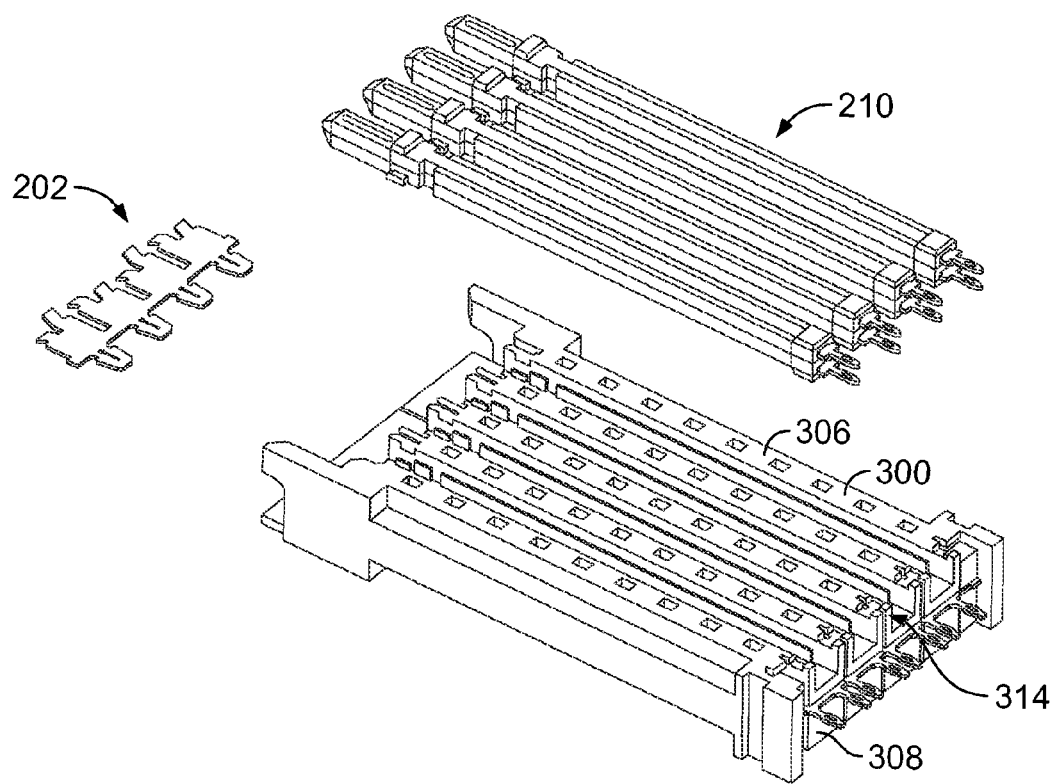
FIG. 7 is an exploded view of another header module of the mezzanine header connector and formed in accordance with an exemplary embodiment.

FIG. 7 is an exploded view of the end header module 202 in accordance with an exemplary embodiment. The end header module 202 may be similar to the middle header module 200 (shown in FIG. 5). However, the end header module 202 receives a contact assembly 210 on only one side of the end header module 202. The other side of the end header module 202 defines an exterior of the mezzanine header connector 102 (shown in FIG. 2), which may define a perimeter wall of the mezzanine header connector 102. Similar components of the end header module 202 and the middle header module 200 are identified with similar terms and reference numerals.

The end header module 202 includes the housing frame 300 having the first chamber 314 at the first side 306; however the housing frame 300 of the end header module 202 does not include a second chamber at the second side 308. When the contact assembly 210 is loaded into the first chamber 314, a portion of the contact assembly 210 extends beyond the first side 306. Such portion of the contact assembly 210 is configured to be received in a middle header module 200 that is positioned adjacent to the end header module 202 (see, for example, FIG. 2).

Figure 8:
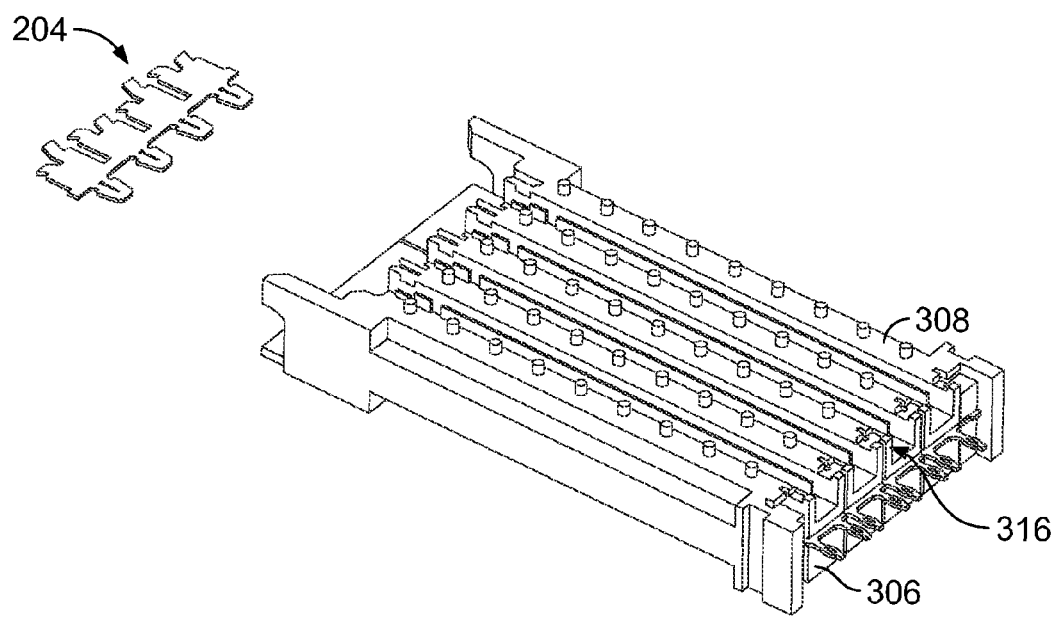
FIG. 8 is an exploded view of another header module of the mezzanine header connector and formed in accordance with an exemplary embodiment.

FIG. 8 is an exploded view of the end header module 204 in accordance with an exemplary embodiment. The end header module 204 may be similar to the middle header module 200 (shown in FIG. 5). However, the end header module 204 receives a contact assembly 210 (shown in FIG. 5) on only one side of the header module 204. Similar components of the end header module 204 and the middle header module 200 are identified with similar terms and reference numerals.

The end header module 204 includes the second chamber 316 at the second side 308; however, the end header module 204 does not include a first chamber at the first side 306. In contrast, the first side 306 defines an exterior of the mezzanine header connector 102 (shown in FIG. 2), which may define a perimeter wall of the mezzanine header connector 102. The second chamber 316 does not receive its own contact assembly 210 (shown in FIG. 5), but rather the second chamber 316 is configured to receive a portion of the contact assembly 210 that extends from the middle header module 200 positioned adjacent the end header module 204 when the end header module 204 is coupled thereto (see, for example, FIG. 2).

Figure 9:
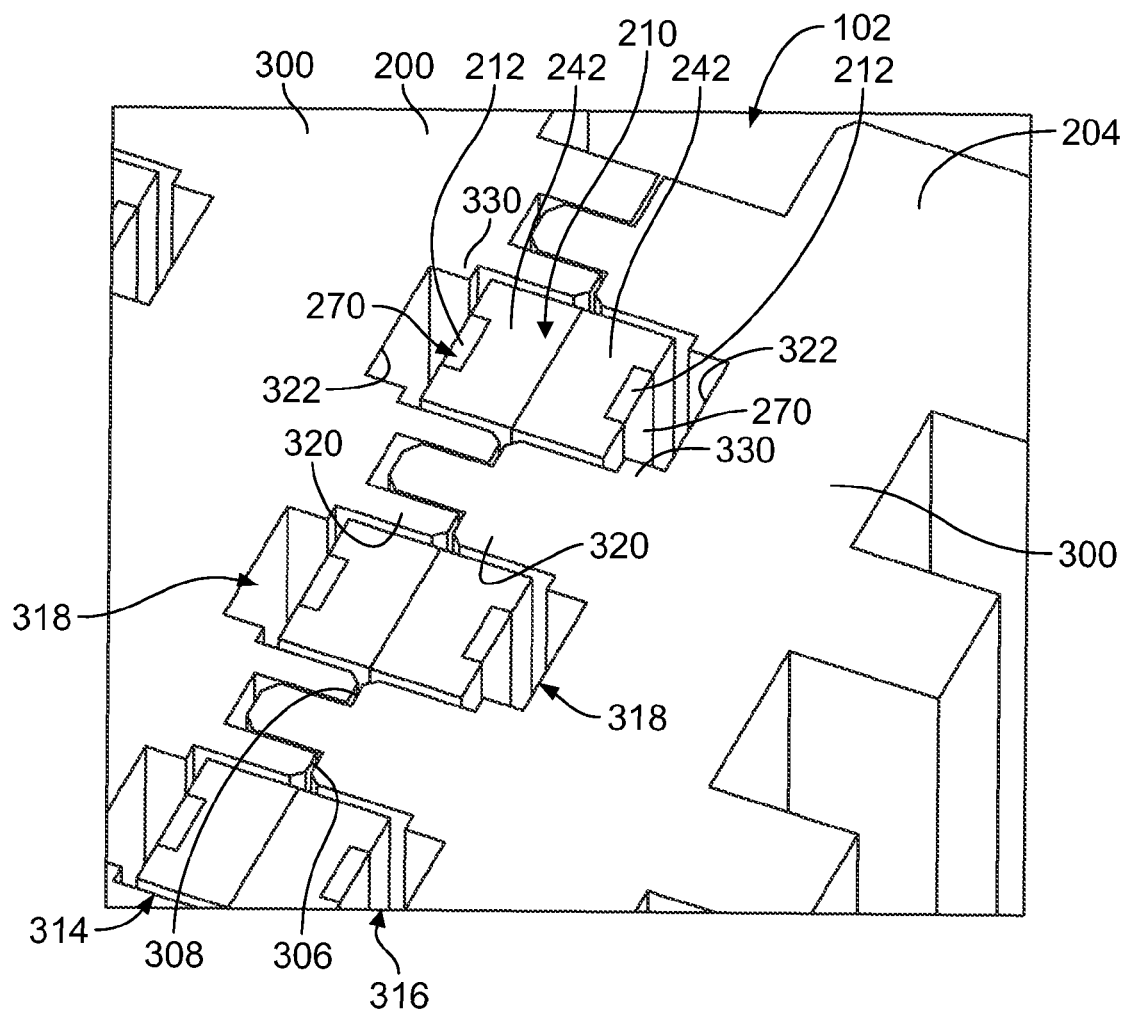
FIG. 9 is a cross-sectional view of a portion of the mezzanine header connector showing various header modules coupled together.

FIG. 9 is a cross-sectional view of a portion of the mezzanine header connector 102 showing the end header module 204 coupled to one of the middle header modules 200. The middle header module 200 holds one of the contact assemblies 210 along the first side 306 thereof. The second side 308 of the end header module 204 is coupled to the first side 306 of the middle header module 200 to receive a portion of the contact assembly 210. When assembled, the contact assembly 210 is held in corresponding pockets 318 of the first chamber 314 of the middle header module 200 and in the pockets 318 of the second chamber 316 of the end header module 204.

The housing frames 300 of the middle header module 200 and the end header module 204 provide electrical shielding around each of the differential pairs of header contacts 212. Each of the pairs of the header contacts 212 is entirely circumferentially surrounded by conductive material of the housing frames 300 to provide 360° shielding along substantially the entire length of the header contacts 212. The contact assembly 210 is arranged in the housing frames 300 such that the side surfaces 270 of the header contacts 212 face the interior walls 322 of the housing frames 300 of the middle header module 200 and the end header module 204. The header contacts 212 are separated from the interior walls 322 by air gaps in the pockets 318.

In an exemplary embodiment, the pockets 318 have shoulders 330 at the corners between the tabs 320 and the interior walls 322. The dielectric holders 242 may abut against the shoulders 330 to locate the contact assembly 210 in the pockets 318. In an exemplary embodiment, the only dielectric material between the header contacts 212 and the housing frames 300 is air. Electrical characteristics of the transmission lines defined by the header contacts 212 may be controlled by controlling the spacing between the header contacts 212 in the interior walls 322. As noted above, electrical characteristics of the transmission lines of the header contacts 212 may be modified by selecting an appropriate dielectric material for the dielectric holders 242 between the header contacts 212. Changing the dielectric material allows the impedance of the header connector 102 to be tuned, such as for matching the impedance to a particular target value, such as 100 ohms, 85 ohms, 92 ohms, or another value.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112(f), unless and until such claim limitations expressly use the phrase "means for" followed by a statement of function void of further structure.

What is claimed is:

1. A mezzanine header connector comprising:
   a contact assembly comprising a pair of contact modules arranged back-to-back, the contact modules each having a dielectric holder holding a plurality of header contacts, the dielectric holder extending between a mating end and a mounting end opposite the mating end, the dielectric holder having an inner side and an outer side, the header contacts having mating segments exposed along the outer side at the mating end for termination to corresponding receptacle contacts of a mezzanine receptacle connector, the header contacts having terminating segments extending from the mounting end of the dielectric holder for termination to a circuit board, each of the header contacts extending along a linear path between the corresponding mating segment and the corresponding terminating segment, the inner sides of the dielectric holders of the pair of contact modules abutting against each other such that the header contacts face away from each other, wherein a length between the mating end and the mounting end is scalable to change a height of the mezzanine header connector.

2. The mezzanine header connector of claim 1, wherein the contact modules are identical and inverted 180 degrees relative to each other.

3. The mezzanine header connector of claim 1, wherein each header contact includes a side surface exposed along a majority of a length thereof between the mating segment and terminating segment.

4. The mezzanine header connector of claim 1, wherein the header contacts are overmolded such that side surfaces of the header contacts are exposed at the outer side of the dielectric holder.

5. The mezzanine header connector of claim 1, wherein the mating segments have convex interference bumps for terminating to the header contacts of the mezzanine receptacle connector.

6. The mezzanine header connector of claim 1, wherein the terminating segments extend beyond a rear edge of the dielectric holder for termination to the circuit board.

7. The mezzanine header connector of claim 1, wherein the dielectric holder includes rails separated by gaps with connecting segments spanning the gaps and connecting adjacent rails, the header contacts extending along corresponding rails of the dielectric holder.

8. The mezzanine header connector of claim 1, wherein the dielectric holder includes cantilevered front support beams supporting corresponding mating segments of the header contacts at the mating end, the support beams having ramped lead-ins forward of the mating segments.

9. The mezzanine header connector of claim 1, wherein the dielectric holder includes pockets behind the mating segments, the pockets being filled with air.

10. The mezzanine header connector of claim 1, wherein the dielectric material of the dielectric housing is selectable to change an impedance of the contact assembly.

11. The mezzanine header connector of claim 1, wherein the contact modules comprise first and second contact modules, the mating segments of the first contact module being aligned with corresponding mating segments of the second contact module on opposite sides of the contact assembly to form differential pairs of header contacts.

12. The mezzanine header connector of claim 11, further comprising a housing frame receiving the contact assembly, the housing frame comprising walls surrounding associated differential pairs of the header contacts, the housing frame being conductive and providing electrical shielding for the differential pairs of header contacts.

13. A mezzanine header connector comprising:
  a contact assembly comprising a first contact module and a second contact module coupled to the first contact module;
  the first contact module comprising a first dielectric holder holding a plurality of first header contacts, the first dielectric holder extending between a mating end and a mounting end opposite the mating end, the first dielectric holder having support beams at the mating end, the first dielectric holder having an inner side and an outer side, the first header contacts having mating segments exposed along the outer side of the support beams at the mating end for termination to corresponding receptacle contacts of a mezzanine receptacle connector, the first header contacts having terminating segments extending from the mounting end of the first dielectric holder for termination to a circuit board, each first header contact extending along a linear path between the corresponding mating segment and the corresponding terminating segment;
  the second contact module comprising a second dielectric holder holding a plurality of second header contacts, the second dielectric holder extending between a mating end and a mounting end opposite the mating end, the second dielectric holder having support beams at the mating end, the second dielectric holder having an inner side and an outer side, the inner side of the second dielectric holder abutting against the inner side of the first dielectric holder, the second header contacts having mating segments exposed along the outer side of the support beams of the second dielectric holder at the mating end thereof for termination to corresponding header contacts of the mezzanine receptacle connector, the second header contacts having terminating segments extending from the mounting end of the second dielectric holder for termination to the circuit board, each second header contact extending along a linear path between the corresponding mating segment and the corresponding terminating segment;
  wherein the inner sides of the support beams of the first and second dielectric holders face each other and are positioned between the mating segments of the first and second contact modules.

14. The mezzanine header connector of claim 13, wherein the first and second contact modules are identical and inverted 180 degrees relative to each other.

15. The mezzanine header connector of claim 13, wherein the header contacts are overmolded by the associated first or second dielectric holder such that side surfaces of the header contacts are exposed at the outer side of the corresponding first or second dielectric holder.

16. The mezzanine header connector of claim 13, wherein the first and second dielectric holders each include rails separated by gaps with connecting segments spanning the gaps and connecting adjacent rails, the header contacts extending along corresponding rails of the first or second dielectric holder, the rails of the first and second dielectric holders abutting against one another such that the gaps are aligned.

17. The mezzanine header connector of claim 13, wherein the mating segments of the first contact module are aligned with corresponding mating segments of the second contact module on opposite sides of the contact assembly to form differential pairs of header contacts.

18. The mezzanine header connector of claim 13, wherein the header contacts are arranged as differential pairs on opposite sides of the contact assembly, the mezzanine header connector further comprising at least one housing frame receiving the contact assembly, the at least one housing frame comprising walls surrounding associated differential pairs of the header contacts, the at least one housing frame being conductive and providing electrical shielding for the differential pairs of header contacts.

19. A mezzanine header connector comprising:
a contact assembly comprising a pair of contact modules arranged back-to-back, the contact modules each having a dielectric holder holding a plurality of header contacts, the dielectric holder extending between a mating end and a mounting end opposite the mating end, the dielectric holder having an inner side and an outer side, the header contacts having mating segments exposed along the outer side at the mating end for termination to corresponding receptacle contacts of a mezzanine receptacle connector, the header contacts having terminating segments extending from the mounting end of the dielectric holder for termination to a circuit board, each of the header contacts extending along a linear path between the corresponding mating segment and the corresponding terminating segment, the inner sides of the dielectric holders of the pair of contact modules abutting against each other such that the header contacts face away from each other; and
a housing frame holding the contact assembly, the housing frame having walls defining pockets receiving corresponding header contacts of the contact assembly, the housing frame being conductive and providing shielding around corresponding header contacts of the contact assembly, the header contacts facing associated walls with air separating the header contacts and the walls along a majority of the header contacts.

* * * * *